United States Patent [19]

Grudkowski et al.

[11] Patent Number: 5,262,659
[45] Date of Patent: Nov. 16, 1993

[54] NYQUIST FREQUENCY BANDWIDTH HACT MEMORY

[75] Inventors: Thomas W. Grudkowski, Glastonbury; Donald E. Cullen, Manchester, both of Conn.

[73] Assignee: United Technologies Corporation, Hartford, Conn.

[21] Appl. No.: 928,374

[22] Filed: Aug. 12, 1992

[51] Int. Cl.$^5$ .................. H01L 29/84; H01L 29/96; H01L 41/08
[52] U.S. Cl. .................. 257/183.1; 257/215; 257/473; 341/172; 341/122; 310/313 R; 310/313 B
[58] Field of Search .......... 257/183.1, 215, 473, 257/11; 341/172, 122; 310/313 R, 313 B

[56] References Cited

U.S. PATENT DOCUMENTS

| | | | |
|---|---|---|---|
| 4,495,431 | 1/1985 | Grudkowski | 257/473 |
| 4,893,161 | 1/1990 | Tanski et al. | 257/183.1 |
| 4,931,752 | 6/1990 | Bray et al. | 310/313 R |
| 4,980,596 | 12/1990 | Sacks et al. | 310/313 D |
| 4,990,814 | 2/1991 | Tanski et al. | 310/313 R |
| 5,070,271 | 12/1991 | Cho et al. | 310/313 R |
| 5,107,310 | 4/1992 | Grudkowski et al. | 257/241 |
| 5,121,121 | 6/1992 | Grudkowski et al. | 341/122 |
| 5,126,706 | 6/1992 | Fleischmann et al. | 310/313 D |
| 5,128,579 | 7/1992 | Carroll et al. | 310/313 R |
| 5,144,262 | 9/1992 | Hunsinger | 310/313 R |
| 5,159,299 | 10/1992 | Cullen et al. | 310/313 R |

Primary Examiner—Rolf Hille
Assistant Examiner—Mahshid Saadat
Attorney, Agent, or Firm—Gerald L. DePardo

[57] ABSTRACT

A HACT device which propagates charge packets 21 along a charge transport channel 17 by a surface acoustic wave (SAW) 14 is provided with an interdigital electrode grid 30 disposed on the upper surface of the HACT, near the charge transport channel 17, having electrodes 30 spaced a distance of one-half wavelength of the SAW. A hold voltage Vh is applied across alternating electrodes to store (i.e., stop and hold) each charge packet. When a charge packet is to be released, the hold voltage Vh is removed and the electrodes 30 are shorted together or alternatively connected through a maximum allowable impedance, thereby allowing each charge packet 21 to be stored and released by the device without having the electrodes 30 absorb the SAW electric fields. Because the electrodes 30 are spaced one-half a SAW wavelength apart, the HACT memory can store each and every charge packet 21, thereby providing a Nyquist bandwidth device. Furthermore, the electrodes 30 are made thin to reduce mechanical absorption of the SAW by the electrodes.

13 Claims, 3 Drawing Sheets

NYQUIST FREQUENCY BANDWIDTH HACT MEMORY

DESCRIPTION

1. Technical Field

This invention relates to Heterojunction Acoustic Charge Transport (HACT) memories and more particularly to a HACT memory capable of storing input signals up to the Nyquist frequency, i.e., store and hold every charge packet.

2. Background Art

It is known in the art that a heterojunction acoustic charge transport (HACT) device comprises a HACT charge transport channel made of a first semiconductor material, e.g., Gallium Arsenide (GaAs), having a first conduction band energy, sandwiched between charge confinement layers made of a second semiconductor material, e.g., Aluminum Gallium Arsenide (GaAs), having a second conduction band energy higher than the first conduction band energy of the charge transport layer. The decrease in conduction band energy from the charge confinement layers to the charge transport layer is called a conduction band well or quantum well, as is known. All these layers are typically grown above a piezoelectric semiconductor substrate, such as GaAs; however, a purely piezoelectric substrate is also acceptable, as is known. A surface acoustic wave (SAW) is injected into the material (typically by a interdigital transducer disposed on an upper surface of the HACT device) and propagates therein. Also, charge is injected into the HACT channel and is carried along the channel, in groups of charge called "charge packets", by an electric field generated by the SAW. Such a HACT device is described in U.S. Pat. No. 4,893,161, entitled "Quantum-Well Acoustic Charge Transport Device" to Tanski et al.

Also, it is known that in a HACT analog memory, an array of memory electrodes is placed on the upper surface of the device, near the charge transport channel, to impose a storage potential on the traveling charge packets. If the storage potential is strong enough to overcome the SAW potential the charge packets can be stopped and held in position even though the SAW continues to propagate. When the storage potential is removed, the SAW transport of the charge packets resumes. Such a HACT memory concept is discussed in copending U.S. patent application Ser. No. 07/658,825, entitled "Acoustic Charge Transport Memory Device", filed Feb. 22, 1991.

However, the electrodes partially short-out (reduce) the SAW electric fields (or SAW energy) and, if the array is too long and/or the memory electrode spacing is too close, the SAW electric fields are reduced to a level where they are not strong enough to provide charge transportation along the channel. Also, the electrodes cause mechanical SAW reflections which reduce the SAW acoustic amplitude. Consequently, the longer the array or the closer the electrode spacing, the more reduction in amplitude that occurs due to the reflections. Thus, SAW reflections limit the maximum physical length of the memory structure and/or the minimum allowable electrode spacing, thereby limiting the maximum amount of data which can be stored in the HACT memory device.

Ideally, a HACT memory would have the memory electrodes spaced a distance of one-half the SAW wavelength apart to allow the electrodes to stop and hold each charge packet. However, with this spacing, the electrodes behave as a SAW transducer which is very effective for converting acoustic energy to electric energy and visa versa, as is known. Thus, this spacing allows the electrodes to absorb a substantial part of the SAW energy.

Therefore, in prior art HACT analog memories, the memory electrodes were placed a distance of one SAW wavelength ($1\lambda$) apart to reduce the effects of mechanical SAW reflections caused by the electrodes and to minimize the shorting-out of the SAW electric fields also caused by the electrodes. With a spacing of one SAW wavelength these effects are reduced because there are less electrodes than when the spacing is one-half a SAW wavelength, and the electrodes are not an effective SAW transducer at one SAW wavelength (i.e., they would be an effective transducer for twice the SAW wavelength being used).

However, if the electrodes are place one SAW wavelength apart, the HACT memory cannot stop and hold (i.e., store) each charge packet individually. More specifically, with one wavelength spacing, individual charge packers are combined with or redistributed among neighboring packets. Thus, if the SAW is viewed like a digital sampler, the HACT memory cannot replicate the maximum frequency response potential of the device (i.e., the Nyquist frequency). Therefore, it is desirable to be able to store and hold every charge packet carried by the SAW, and, hence, provide a Nyquist bandwidth HACT memory.

DISCLOSURE OF INVENTION

Objects of the invention include provision of a Heterojunction Acoustic Charge Transport (HACT) analog memory which can store every charge packet carried by the SAW.

According to the present invention, a HACT memory device comprises a charge transport layer (or channel) grown above a lower charge confinement layer. Charge packets are transported by a SAW along the charge transport channel. A memory electrode array (or grid) is disposed on an upper surface of the HACT near the charge transport channel and a hold voltage is applied across alternating electrodes to stop and hold (i.e., store) the charge packets. To release the held charge packets, the hold voltage is removed and the electrodes are shorted together through a maximum allowed impedance, thereby providing minimal SAW energy absorption by the electrodes.

According further to the invention, an upper charge confinement layer is grown above the charge transport layer. According still further to the invention, a control circuit provides a signal which indicates when the hold voltage is to be applied to the memory electrodes.

In still further accord to the invention, the width and thickness of the electrodes are minimized to minimize the mechanical SAW reflections caused thereby.

The invention represents a significant improvement over prior HACT analog memories because each and every charge packet may be stored and released and ultimately retrieved, thereby providing maximum frequency bandwidth of the HACT memory. Also, mechanical SAW reflections are minimized by making the width and thickness of the electrodes very thin while not sacrificing electrical continuity.

The foregoing and other objects, features and advantages of the present invention will become more apparent in light of the following detailed description of exemplary embodiments thereof as illustrated in the accompanying drawings.

BEST MODE FOR CARRYING OUT THE INVENTION

Figure 1:
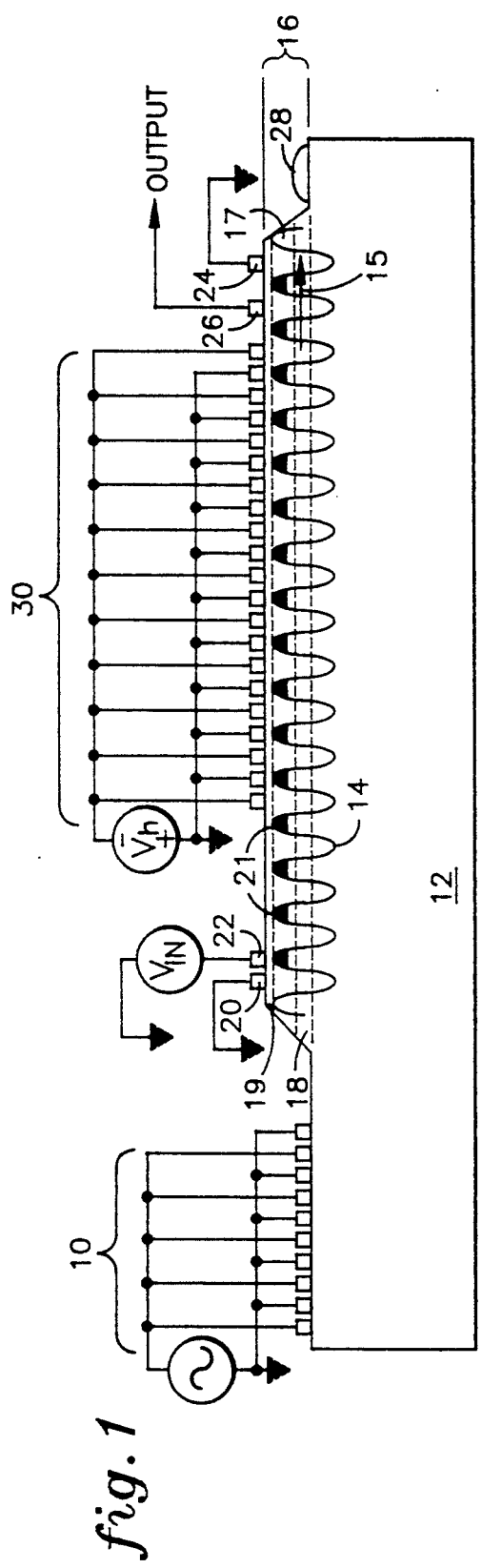
FIG. 1 is a diagram showing the HACT memory device, in accordance with the present invention.

Referring to FIG. 1, a HACT analog memory device comprises a known SAW transducer 10 disposed on the surface of a known HACT substrate 12 made of, e.g., Gallium Arsenide (GaAs). The SAW transducer injects a surface acoustic wave (SAW) 14 into the HACT substrate, as is known, which travels along the HACT with a known velocity in a direction indicated by an arrow 15. The upper portion of the HACT memory comprises epitaxial layers grown above the substrate 12 comprising a charge transport region 16 which comprises a charge transport layer (or channel) 17 made of, e.g., GaAs, sandwiched between two charge confinement layers 18,19 made of, e.g., Aluminum Gallium Arsenide (AlGaAs), as is also known. Above the AlGaAs upper charge confinement layer, at the upper outer surface of the device, is a known thin cap layer (not shown) made of GaAs which is employed to allow ohmic contact of electrodes to the HACT and to isolate the AlGaAs layer from outside air, thereby preventing oxidation of the AlGaAs.

Charge is injected into the HACT channel 17 from an ohmic contact source electrode 20 and is carried along the channel 17 by the SAW 14 in groups or charge packets 21. The amount of charge injected into the channel is controlled by a voltage Vin applied to a Schottky contact charge control electrode 22. The charge control electrode 22 regulates the amount of electrons to enter the channel 17.

At the opposite end of the HACT is an ohmic contact drain electrode 24 for draining or removing the charge from the channel to avoid charge build-up. Also, the HACT comprises a Schottky contact output electrode 26 (i.e., nondestructive sensing tap) which is used to detect (or sense) the charge packets travelling in the channel 17 without disturbing the charge carried within the channel. An acoustic absorber 28, e.g., a rubber knob, is provided to absorb the mechanical SAW 14 energy, thereby avoiding mechanical (acoustic) reverberations of the SAW backwards along the device, as is known. A similar HACT device, and variations thereon, is discussed in aforementioned U.S. Pat. No. 4,893,161 to Tanski et al.

The HACT memory further comprises an electrode grid 30 of interdigital electrodes (fingers) similar to that of the SAW transducer 10. More specifically, to store 3 microseconds of data for a SAW with a frequency of 143.6 MegaHertz (MHz), a SAW wavelength of 20 microns, and a SAW velocity of 2872 meters/sec, the memory electrode grid has 862 total fingers (about 4-5 times more fingers than the SAW transducer). Other SAW wavelengths may be used if desired, which, as is known, is one characteristic that determines the design of the SAW transducer.

A hold voltage Vh, e.g., 3 to 6 vdc, is applied across the electrodes which invokes an electric field that overpowers the SAW electric field thereby stopping and holding the charge travelling within the channel, as discussed hereinbefore. When the hold voltage Vh is removed, the charge packets 21 are released, thereby allowing the SAW to propagate the charge packets along the channel 17.

Figure 6:
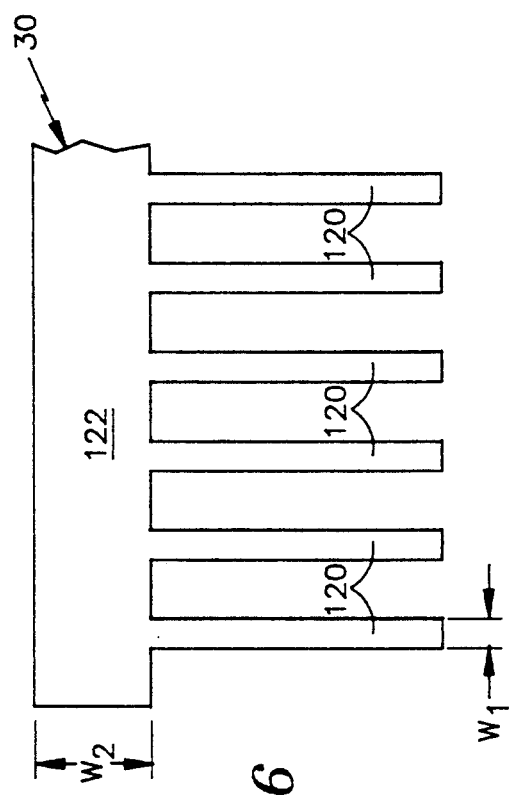
FIG. 6 is a cut away top view of one side of the memory electrode grid, in accordance with the present invention.
Figure 4:
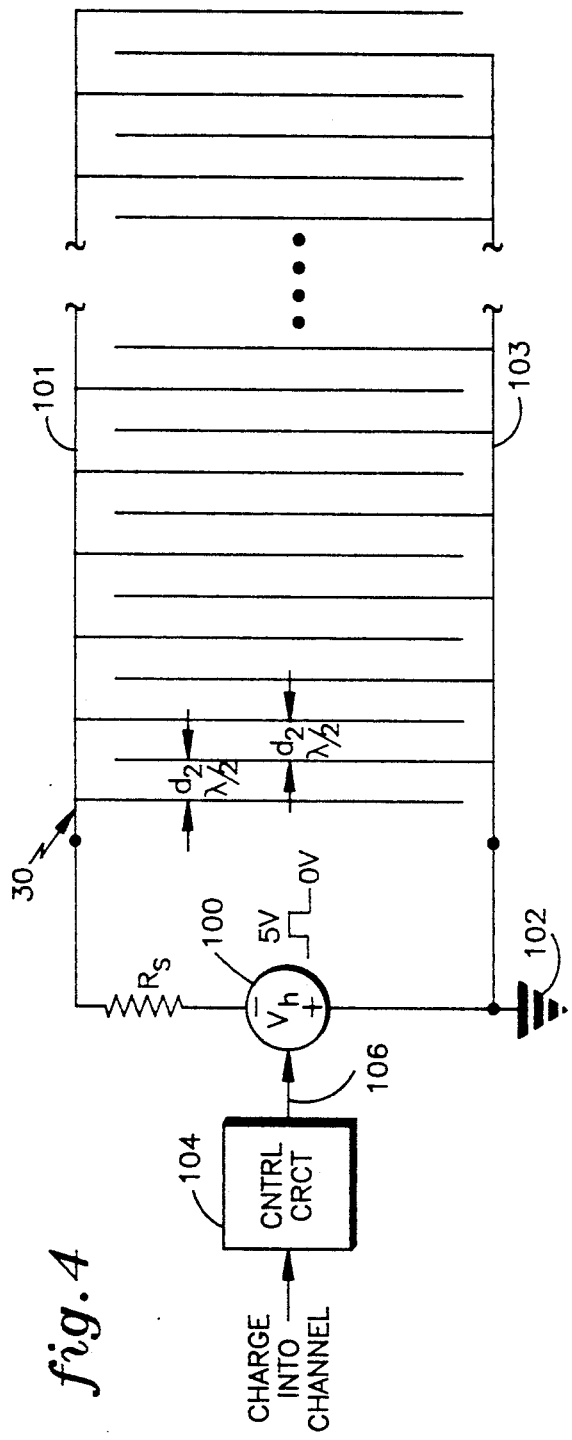
FIG. 4 is a diagram of the memory electrodes with a pulsed voltage source having a maximum allowable source impedance, in accordance with the present invention.
Figure 5:
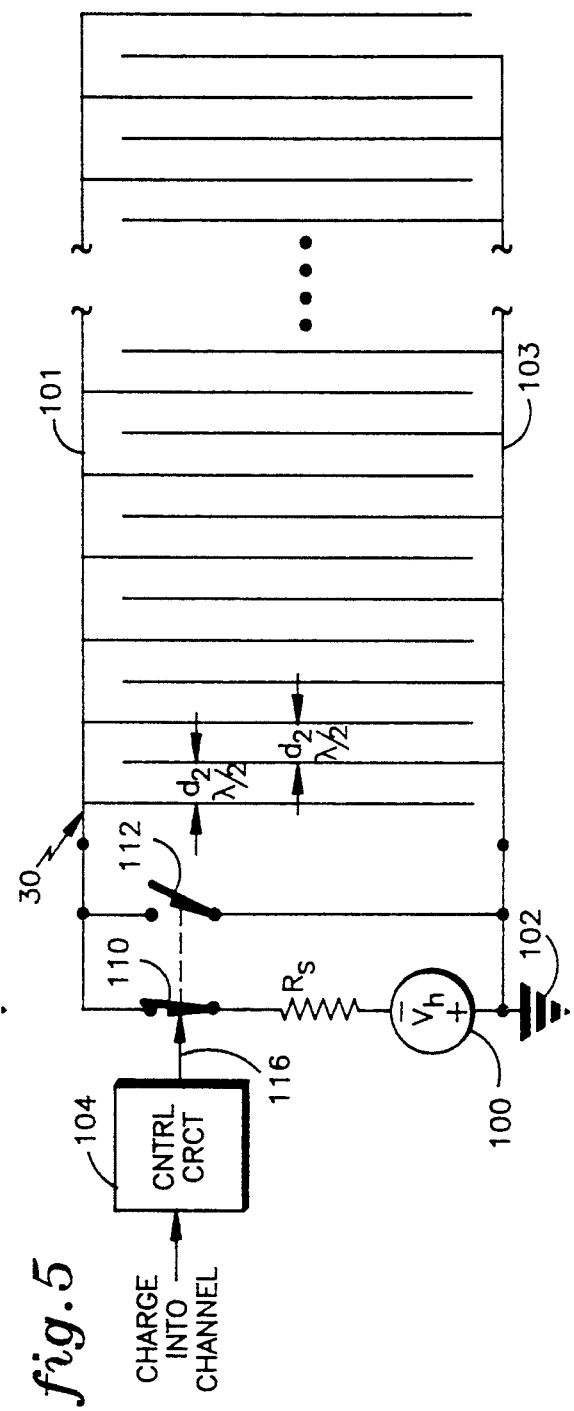
FIG. 5 is a diagram of the memory electrodes with a pair of switches used to short out the memory electrodes, in accordance with the present invention.

In FIG. 1, the electrode arrays for both the SAW transducer 10 and the memory electrodes 30 are shown for illustrative purposes as being connected by wires that are not touching the surface of the HACT. However, it should be understood that each polarity group of electrodes are connected together by a bus-bar (or pad) which is disposed on the same surface of the HACT as the electrodes (or fingers), as shown in FIGS. 4, 5, and 6 (discussed hereinafter).

Figure 2:
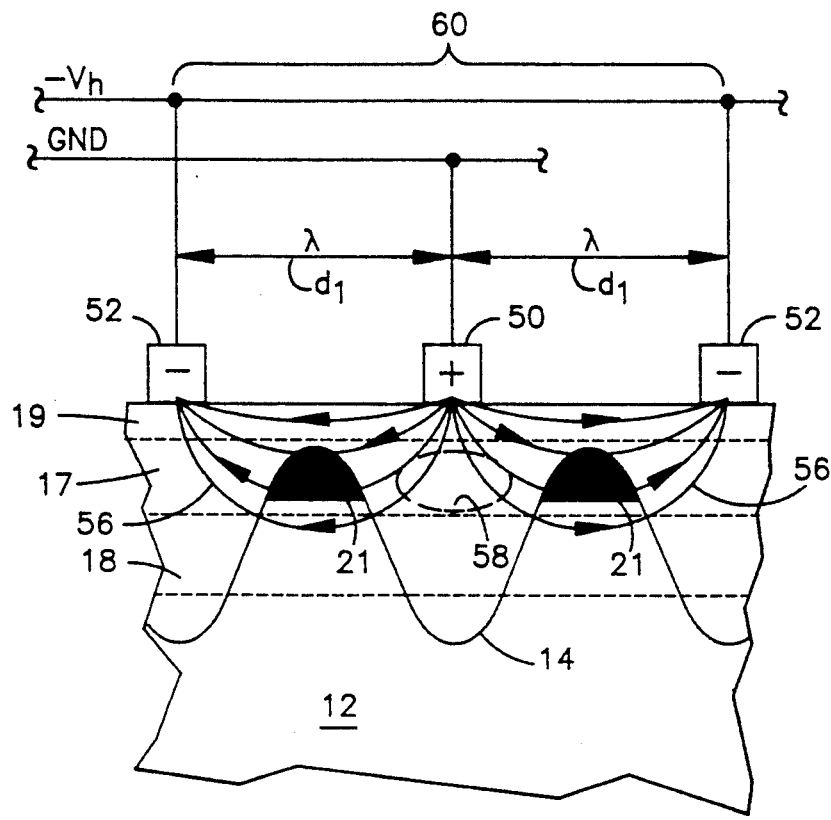
FIG. 2 is a blown-up detail cut away diagram showing a prior art spacing of memory electrodes of one SAW wavelength, electric fields generated by a hold voltage, and the effect on charge packers carried by the SAW.

Referring to FIG. 2, when the distance d1 between alternate memory electrodes is equal to one SAW wavelength, as in a conventional prior art HACT device, the charge packets are initially held between a ground (0 volts) electrode 50 and $-V_h$ electrodes 52 by electric fields 56 imposed by the difference in potential. However, the charge packets will have a tendency to collect and combine into a group 58 near the ground electrode 50 and, thus, the data carried by each individual charge packet is lost. Thus, when the electrodes are spaced one SAW wavelength apart a single memory cell 60 spans a distance of 2 SAW wavelengths.

Figure 3:
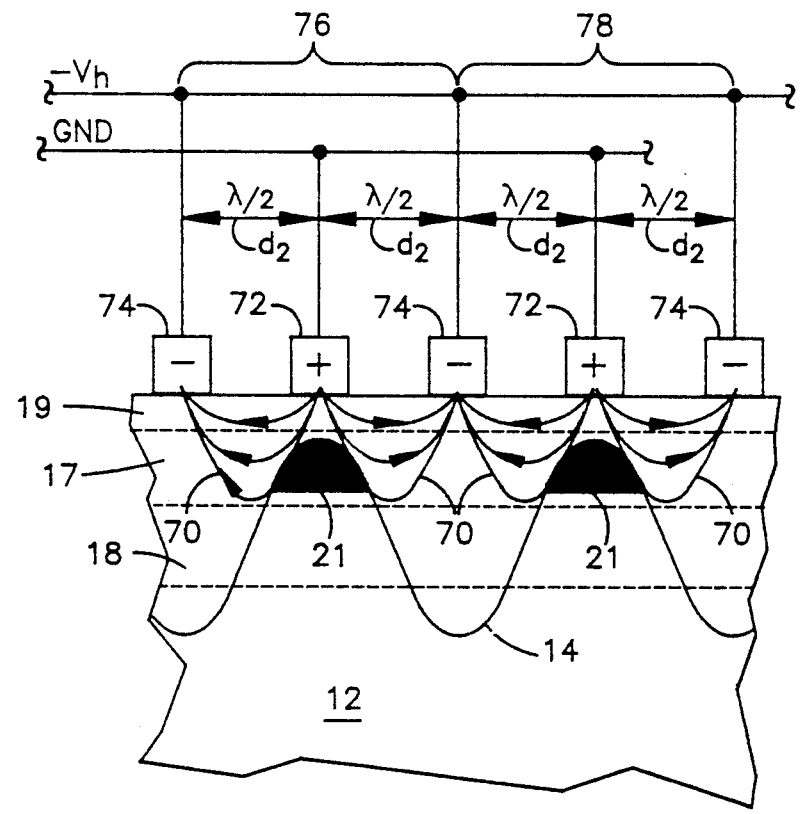
FIG. 3 is a blown-up detail cut away diagram showing the spacing of memory electrodes of one-half SAW wavelength, electric fields generated by a hold voltage, and the effect on charge packets carried by the SAW, in accordance with the present invention.

Referring to FIG. 3, when the distance d2 between alternately polarized memory electrodes are placed half a SAW wavelength apart, e.g., 10 microns on center for a SAW frequency of 143.6 MHz, electric fields 70 generated by the applied hold voltage $-V_h$ fringe from the grounded electrodes 72 to $-V_h$ electrodes 74 and hold each individual charge packet in place underneath the grounded electrodes 72 and not allow neighboring charge packets to interfere or combine with each other. Thus, two memory cells 76,78, (one for each charge packet 21) are provided, with each memory cell spanning a distance of one SAW wavelength.

It was originally thought by those skilled in the art of HACTs that placing the electrodes at one-half a SAW wavelength apart would result in unacceptable electrical absorption of the SAW by the electrodes because the electrodes would behave as a SAW transducer, i.e., have a spacing which is effective for converting acoustic to electrical energy, and visa versa (as discussed hereinbefore). Thus, it was thought that such a configuration would reduce the SAW electric fields needed to transport the charge packets along the channel 17 (FIG. 1).

However, we have found that the memory electrodes may be placed one-half a SAW wavelength apart based on two findings. First, when the hold voltage Vh is applied to the electrodes to hold the charge packets, the effects of both electrical absorption and mechanical reflection of the SAW are irrelevant because the packers have stopped moving. In fact, the SAW could even be turned off during the hold time provided the SAW is turned back on a predetermined amount of time prior to releasing the charge to ensure the SAW has reached the charge packets to be released. Second, when the voltage is not applied to the electrodes, if the electrodes are shorted together or the impedance seen between the electrodes is below a certain value, e.g., 50 ohms, the electrical absorption of the SAW electric fields is minimized because the electrode grid can no longer behave like an effective SAW transducer.

Referring to FIG. 4, a pulsed voltage source 100 is connected across the memory grid 30 having an internal source impedance Rs in series therewith, which is shown external to the source 100 for illustrative purposes. The negative side of the source 100 is connected to one side 101 (or first bank of electrodes) of the memory grid 30 and the positive side of the source 100 is connected to a ground potential 102 and is connected to the other side 103 (or second bank of electrodes) of the memory grid 30.

A control circuit 104 (discussed hereinafter) controls when the pulsed voltage source 100 generates a pulse which determines the length of time of the voltage Vh pulse, by a signal on a line 106. When the charge packets are to be held in place, the voltage source 100 generates a high pulse of 3 to 6 vdc, e.g., 5 vdc. When the charge packets are to be released, the voltage source 100 provides a low voltage, e.g., 0 vdc, which will apply the source impedance Rs across the grid 30. We have found that with a source impedance Rs of about 50 ohms, the grid 30 does not absorb an unacceptable amount of SAW electric field energy and thus allows the SAW to propagate the charge packets to the output electrode 26 (FIG. 1).

Referring to FIG. 5, alternatively, instead of pulsing the voltage source 100, the source 100 may be configured to provide a constant hold voltage Vh and, along with a pair of switches 110,112 connected to the grid 30, may apply and remove the hold voltage Vh. The switch 110 is connected in series with the source 100 and the switch 112 is connected across the grid 30 in parallel with the series combination of the switch 110 and the source 100. The wipers of the switches 110,112 are connected together and driven by the control circuit 104 (discussed hereinafter) by a signal on a line 116. When the switch 110 is closed, the switch 112 is open and the hold voltage Vh from the voltage source 100 is applied to the grid 30. When the switch 110 is open, the switch 112 is closed and the grid 30 is shorted together through the switch 112. This embodiment provides minimum (close to zero) resistance between the two sides 101,103 of the grid 30 and does not depend on the source impedance Rs of the source 100. The switches may comprise any electronic or mechanical devices that do not conduct electricity when open and that conduct electricity when closed and the switch 112 must have an "on" resistance that does not exceed the maximum allowable impedance discussed hereinbefore, e.g., transistors or relays. It should be understood that the switches 110,112 should be configured to not be closed at the same time to prevent damaging the voltage source 100.

This may be accomplished by ensuring that the switches 110,112 are both open before one switch is closed. Also, the switches will always be in opposite states when in a steady state condition. Other switch configurations with different numbers of switches may be used provided the hold voltage Vh is applied across the grid 30 on demand and, when the hold voltage Vh is not being applied, both sides of the grid are shorted together through a resistance that does not exceed the maximum allowable impedance.

Although the invention has been described as having one side of the voltage source 100 and one side 103 of the grid 30 connected to ground potential, it should be understood that the side 103 may be connected to a potential other than ground but, not so high as to cause forward biasing of the Schottky contact, which would extract charge from the charge packets to the electrodes.

Also, a negative voltage should be used for Vh to prevent charge extraction from the charge packets when the charge packets carry electrons. Alternatively, if the charge packets carry holes, the hold voltage Vh applied should be positive, thereby holding the charge packets (carrying holes) also under the grounded electrodes.

Referring to FIGS. 4 and 5, the control circuit 104 determines when to drive the voltage source 100 or, alternatively, the switches 110,112, to apply the hold voltage Vh to the memory electrodes. The control circuit 104 comprises known electronics, such as digital logic, a timer, and output drivers, which monitors the charge input into the channel and, by knowing the SAW velocity and the distance from the charge injection electrodes 20,22 (FIG. 1) to the memory cell electrodes where the data is to be stored, counts a predetermined amount of time until the desired charge packet is underneath the desired memory cell (or group of electrodes). When the predetermined time elapses, the control circuit outputs a signal to the voltage source 100 or, alternatively, to the switches 110,112 to indicate that the hold voltage should be applied. Also, it should be understood that the control circuit may alternatively be implemented by a digital computer, as is known in the art.

Referring to FIG. 6, to reduce the effects of mechanical reflections due to the electrodes, the mass of the electrodes (fingers must be minimized. Each side of the grid 30 of the invention has fingers 120 having a width W1 of 1 micron and a bus-bar 122 (or pads) connecting all the fingers 120 having a width W2 of 0.25 millimeters. Note that FIG. 6 is not drawn to scale. Other electrode and bus-bar widths may be used if desired. Also, the fingers have a total thickness (not shown) of 400 Å comprising 100 Å of Titanium against the upper surface of the HACT followed by 300 Å of Aluminum. Other thicknesses may be used if desired; however, there is a trade-off between making it thin enough to minimize mechanical acoustic SAW reflections and still making a good conductor for applying the hold voltage. The total thickness of the pad 122 is about 2000 Å, much thicker than the fingers, to provide mechanical strength for bonding. Note that the thickness of the pads 122 is not critical because the channel where charge packets propagate is located between the pads 122 (looking from a top view).

Instead of or in addition to making the electrodes thin as discussed above, mechanical reflections of the memory electrodes may be reduced as discussed in U.S. Pat.

No. 4,495,431, entitled "Low Reflectivity Surface-Mounted Electrodes on Semiconductive SAW Devices", to Grudkowski. In that case, the electrodes comprise a layer of gold-germanium mixture and a layer of raw gold, or only a gold germanium mixture, where the total germanium content comprises about 2 to 3% of the total gold-germanium content, and the thickness is about 1% of the SAW wavelength.

Also, the memory electrode grid 30 should be located close enough to the charge transport channel 17, e.g., 1 SAW $\lambda/200$ microns using a 5 vdc hold voltage, to inject an electric field strong enough to stop and hold the charge packers 21 within the channel 17. It should be understood that this distance is determined by the thickness of the epitaxial layer structure (i.e., the charge confinement layers and cap layer), as is known.

Instead of having both upper and lower confinement layers 18,19, the invention will also work with a HACT having only a lower confinement layer 18. Such a HACT is disclosed in U.S. Pat. No. 5,128,734 to Cullen et al, entitled "Surface Channel HACT". In that case the upper edge of the quantum well conduction band energy is provided by a surface potential, as is known.

Even though the invention has been described as having the charge transport region 16 (FIG. 1) being grown from and contiguous with the substrate 12, it should be understood by those skilled in the art that the charge transport region 16 may be removed from the substrate and placed near a highly piezoelectric material which is used to propagate the SAW, such as Lithium Niobate ($LiNbO_3$) or any other material that exhibits highly piezoelectric properties, as described in U.S. Pat. No. 4,990,814, entitled "Separated Substrate Acoustic Charge Transport Device", to Tanski et al.

Also, it should be understood that although the invention is described as using electrodes for charge injection, removal, and detection (output), the invention will work equally well using any technique for injecting charge into, removing charge from, or detecting charge within, the charge transport channel. For example, the charge injection may be performed by an optical input instead of using electrodes and a voltage source, as described in U.S. Pat. No. 4,980,596 to Sacks et al., entitled "Acoustic Charge Transport Device Having Direct Optical Input", issued Dec. 25, 1990.

Although the invention has been described and illustrated with respect to exemplary embodiments thereof, it should be understood by those skilled in the art that the foregoing and various other changes, omissions and additions may be made without departing from the spirit and scope of the invention.

We claim:

1. A HACT memory device having a SAW propagating therein and having charge packets being carried by the SAW, comprising:
    a piezoelectric substrate;
    a lower charge confinement layer of semiconductor material, disposed near said substrate, having a first conduction band energy;
    a charge transport layer of semiconductor material disposed above and contiguous with said lower charge confinement layer;
    said charge transport layer having a second conduction band energy less than said first conduction band energy of said lower charge confinement layer, for confining the charge packets to said charge transport layer;
    charge injection means, disposed on an outer surface of said HACT, for injecting mobile charge carriers into said charge transport layer;
    charge detection means, disposed on said outer surface of said HACT, for detecting the flow of charge in said charge transport layer;
    a hold voltage source providing a hold voltage signal, said hold voltage signal having a magnitude large enough to stop and hold the charge packets travelling along said charge transport layer;
    a plurality of interdigital memory electrodes disposed on said outer surface of said HACT near said charge transport layer and between said charge injection means and said charge detection means, said memory electrodes being spaced a distance of substantially one-half of a wavelength of said SAW;
    every other electrode of said memory electrodes being connected to said hold voltage source and the remaining electrodes of said memory electrodes being connected to near ground potential; and
    said memory electrodes being connected to each other and said hold voltage source so as to provide an impedance between adjacent electrodes that does not exceed a predetermined maximum allowable impedance when said hold voltage signal is not being applied.

2. The HACT memory device according to claim 1, further comprising an upper charge confinement layer of semiconductor material disposed above and contiguous with said charge transport layer, having a third conduction band energy above said second conduction band energy of said charge transport layer, for assisting in confining the charge packets to said charge transport layer.

3. The HACT memory device according to claim 1, wherein said substrate comprises GaAs, said upper and lower charge confinement layers comprise AlGaAs, and said charge transport layer comprises GaAs.

4. The HACT memory device according to claim 1, wherein said memory electrodes comprise a first bank of electrodes and a second bank of electrodes and wherein said hold voltage source comprises a pulsed voltage source connected across said first bank and said second bank, said pulsed voltage source having a source impedance not exceeding said maximum allowable impedance, and being responsive to a command signal.

5. The HACT memory device according to claim 4, further comprising hold voltage control means responsive to charge injected into said charge transport layer, for providing said command signal to said pulsed voltage source indicative of when to apply and remove said hold voltage signal.

6. The HACT memory device according to claim 1, wherein said memory electrodes comprise a first bank of electrodes and a second bank of electrodes and wherein said hold voltage source comprises a constant voltage source connected to a plurality of switches so as to apply said hold voltage signal across said first and said second banks in response to a command signal and, when said hold voltage signal is not being applied, said first and said second banks are connected together through a resistance that does not exceed said maximum allowable impedance.

7. The HACT memory device according to claim 6, further comprising hold voltage control means responsive to charge injected into said charge transport layer, for providing said command signal to said switches indicative of when to apply and remove said hold voltage signal.

8. The HACT memory device according to claim 1, wherein said memory electrodes comprise a first bank of electrodes and a second bank of electrodes and wherein said hold voltage comprises a constant voltage source connected in series with a first switch, said constant voltage source and said first switch being in parallel with a second switch, said second switch being connected across said first bank and said second bank to provide substantially a short circuit across said first bank and said second bank, said first and said second switches being responsive to a common command signal to open and close, said second switch having an "on" impedance not exceeding said maximum allowable impedance, said first and second switches being in opposite states when in steady state condition.

9. The HACT memory device according to claim 8, further comprising hold voltage control means responsive to charge injected into said charge transport layer, for providing said common command signal to said first and said second switches indicative of when to apply and remove said hold voltage signal.

10. The HACT memory device according to claim 1, wherein said maximum allowable impedance is 50 ohms.

11. The HACT memory device according to claim 1, wherein said hold voltage signal is negative with respect to ground and the charge packets carry electrons.

12. The HACT memory device according to claim 1, wherein said memory electrodes have a width and thickness set to minimize mechanical SAW reflections while maintaining acceptable electrical contact to apply said hold voltage signal.

13. The HACT memory device according to claim 1, wherein said memory electrodes thickness comprises 100 Å of Titanium against said upper surface of the HACT and 300 Å of Aluminum against said Titanium.

* * * * *